(12) United States Patent
Huang et al.

(10) Patent No.: US 8,404,501 B2
(45) Date of Patent: Mar. 26, 2013

(54) SEMICONDUCTOR PACKAGE STRUCTURE AND MANUFACTURING METHOD THEREOF

(75) Inventors: Po-Yao Huang, Hsinchu County (TW); Chia-Yu Jin, Hsinchu County (TW); Yeong-Jar Chang, Hsinchu County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 282 days.

(21) Appl. No.: 12/961,512

(22) Filed: Dec. 7, 2010

(65) Prior Publication Data

US 2012/0138961 A1   Jun. 7, 2012

(51) Int. Cl.
H01L 21/00 (2006.01)
H01L 27/15 (2006.01)
H01L 31/12 (2006.01)
H01L 33/00 (2010.01)

(52) U.S. Cl. .............. 438/25; 257/81; 257/E33.056; 257/E33.077

(58) Field of Classification Search .............. 438/25; 257/81, E33.056, E33.077
See application file for complete search history.

(56) References Cited

U.S. PATENT DOCUMENTS

| 2005/0116245 | A1* | 6/2005 | Aitken et al. | 257/99 |
| 2010/0221016 | A1* | 9/2010 | Tanaka et al. | 398/138 |
| 2012/0025209 | A1* | 2/2012 | Kim et al. | 257/81 |
| 2012/0168776 | A1* | 7/2012 | Nakamura et al. | 257/80 |

* cited by examiner

Primary Examiner — David S Blum
(74) Attorney, Agent, or Firm — Winston Hsu; Scott Margo (57) ABSTRACT

A semiconductor package structure includes a package substrate, at least a chip, solder balls, a light emitting/receiving device, a optical intermediary device and an optical transmission device. The package substrate has a first surface, a second surface, a circuit and solder ball pads, wherein each solder ball pad is electrically connected to the circuit. The chip is disposed on the first surface and electrically connected to the circuit. The solder balls are respectively disposed on the solder ball pads. The light emitting/receiving device is disposed on the package substrate and electrically connected to the circuit. The optical intermediary device is disposed above the light emitting/receiving device. The optical transmission device is inserted in the optical intermediary device, wherein a light emitting by the light emitting/receiving device is emitted to the optical transmission device via the optical intermediary device so that an optical signal is transmitted through the optical transmission device.

34 Claims, 8 Drawing Sheets

SEMICONDUCTOR PACKAGE STRUCTURE AND MANUFACTURING METHOD THEREOF

BACKGROUND OF THE INVENTION

1. Field of the Invention

The present invention generally relates to a package structure and manufacturing method thereof, in particular, to a semiconductor package structure and manufacturing method thereof.

2. Description of Related Art

A purpose of chip package is to protect a bare chip, reduce a density of chip contacts and provide a good heat dissipation effect for the chip. Regardless of installing the chip onto a circuit substrate to reduce the density of the chip contacts, or directly forming a redistribution circuit on the chip to reduce the density of the chip contacts, metal (for example, copper) having a good conductivity is generally used as a material of all signal paths of the circuit substrate or the reconfiguration circuit. When the chip contacts are continuously increased, the required signal paths are accordingly increased, so that a size of a chip package structure is also increased.

SUMMARY OF THE INVENTION

The present invention is directed to a semiconductor package structure and manufacturing method thereof, which has advantages of small size, high transmission efficiency and high signal transmission density.

The invention provides a semiconductor package structure including a package substrate, at least a chip, a plurality of solder balls, a light emitting/receiving device, an optical intermediary device and an optical transmission device is provided. The package substrate has a first surface, an opposite second surface, a circuit disposed on the first surface and a plurality of solder ball pads disposed on the second surface, wherein each solder ball pad is electrically connected to the circuit. The chip is disposed on the first surface of the package substrate and electrically connected to the circuit. The solder balls are respectively disposed on the solder ball pads. The light emitting/receiving device is disposed on the package substrate and electrically connected to the circuit, wherein the light emitting/receiving device is used for emitting or receiving light. The optical intermediary device is disposed above the light emitting/receiving device. The optical transmission device is inserted in the optical intermediary device, wherein a light emitting by the light emitting/receiving device is emitted to the optical transmission device via the optical intermediary device so that an optical signal is transmitted through the optical transmission device.

The invention provides a manufacturing method of a semiconductor package structure. A package substrate having at least a chip and a plurality of solder balls fixed thereon is provided, wherein the package substrate has a first surface, an opposite second surface, a circuit disposed on the first surface and a plurality of solder ball pads disposed on the second surface, each solder ball pad is electrically connected to the circuit, the chip is disposed on the first surface and electrically connected to the circuit, and the solder balls are respectively disposed on the solder ball pads. A light emitting/receiving device is disposed on the package substrate and electrically connected to the circuit, wherein the light emitting/receiving device is used for emitting or receiving light. An optical intermediary device is disposed above the light emitting/receiving device. An optical transmission device is inserted in the optical intermediary device, wherein a light emitting by the light emitting/receiving device is emitted to the optical transmission device via the optical intermediary device so that an optical signal is transmitted through the optical transmission device.

According to the above descriptions, the semiconductor package structure of the invention has a light emitting/receiving device, an optical intermediary device and an optical transmission device, and the a light emitting by the light emitting/receiving device is emitted to the optical transmission device via the optical intermediary device, so that an optical signal is transmitted through the optical transmission device. Therefore, the design of the semiconductor package structure of the invention has advantages of small size, high transmission efficiency and high signal transmission density.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
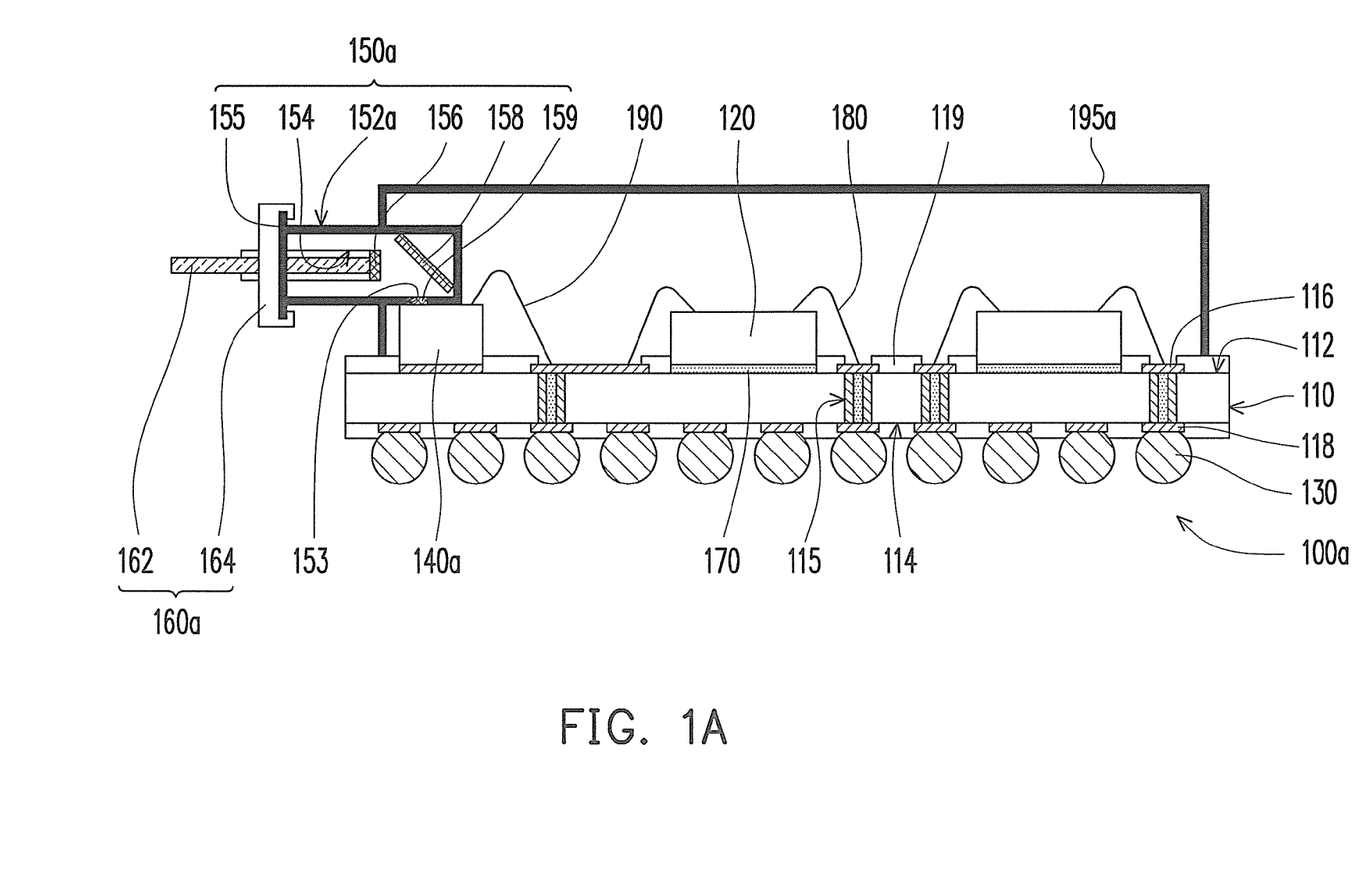
FIG. 1A is a cross-sectional view of a semiconductor package structure according to an embodiment of the invention.

FIG. 1A is a cross-sectional view of a semiconductor package structure according to an embodiment of the invention. Referring to FIG. 1A, in the invention, a semiconductor package structure 100a including a package substrate 110, at least a chip 120, a plurality of solder balls 130, a light emitting/receiving device 140a, an optical intermediary device 150a and an optical transmission device 160a is provided.

The package substrate 110 has a first surface 112, an opposite second surface 114, a circuit 116 disposed on the first surface 112, a plurality of solder ball pads 118 disposed on the second surface 114 and a protective layer 119 disposed on the first surface 112 and exposed a portion of the circuit 116, wherein each solder ball pad 118 is electrically connected to the circuit 116 by a conductive through hole structure 115. The chip 120 is disposed on the first surface 112 of the package substrate 110 and electrically connected to the circuit 116. Herein, the chip 120 is bonded to the package substrate 110 by an adhesive layer 170, and the chip 120 is electrically connected to the circuit 116 by wire bonding. Namely, the chip 120 is electrically connected to the circuit 116 by a plurality of the bonding wires 180. The solder balls 130 are respectively disposed on the solder ball pads 118 to serve as a bridge for electrically connecting the semiconductor package structure 100 and an external circuit (not shown).

The light emitting/receiving device 140a is disposed on the package substrate 110 and electrically connected to the circuit 116, wherein the light emitting/receiving device 140a is, for example, a vertical-cavity surface emitting laser array, and used for emitting or receiving light. Moreover, the light emitting/receiving device 140a is electrically connected to the circuit 116 of the package substrate 110 by at least a bonding wire 190.

The optical intermediary device 150a is disposed above the light emitting/receiving device 140a. In the present embodiment, the optical intermediary device 150a includes a housing 152a, an optical channel 154, a second locking portion 155, a first lens array 156, a total internal reflection mirror 158, and a second lens array 159. The optical channel 154, the first lens array 156 and the total internal reflection mirror 158 are disposed inside the housing 152a. The second locking portion 155 covers an end of the optical channel 154, and the first lens array 156 is disposed on the other end of the optical channel 154. Moreover, the housing 152a has a opening 153, and the second lens array 159 is disposed in the opening 153 and connected to the light emitting/receiving device 140a. A material of the second locking portion 155 is metal or heat insulation material.

Figure 1B:
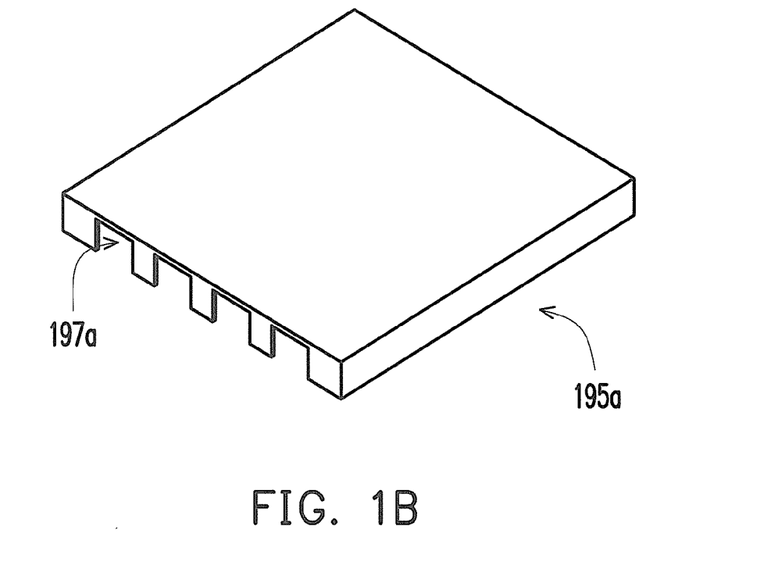
FIG. 1B is a schematic three-dimensional view of the sealing device as depicted in FIG. 1A.
Figure 1C:
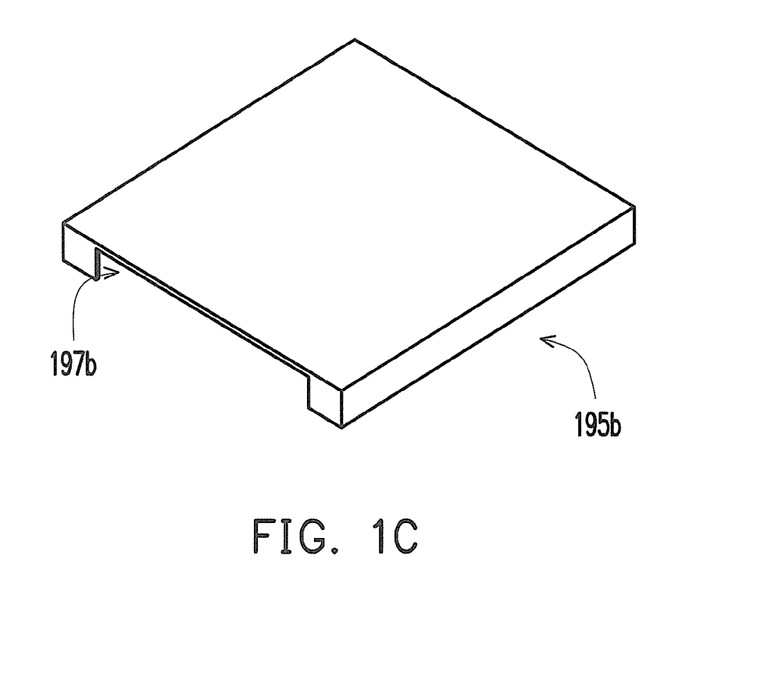
FIG. 1C is another schematic three-dimensional view of the sealing device as depicted in FIG. 1A.
Figure 1D:
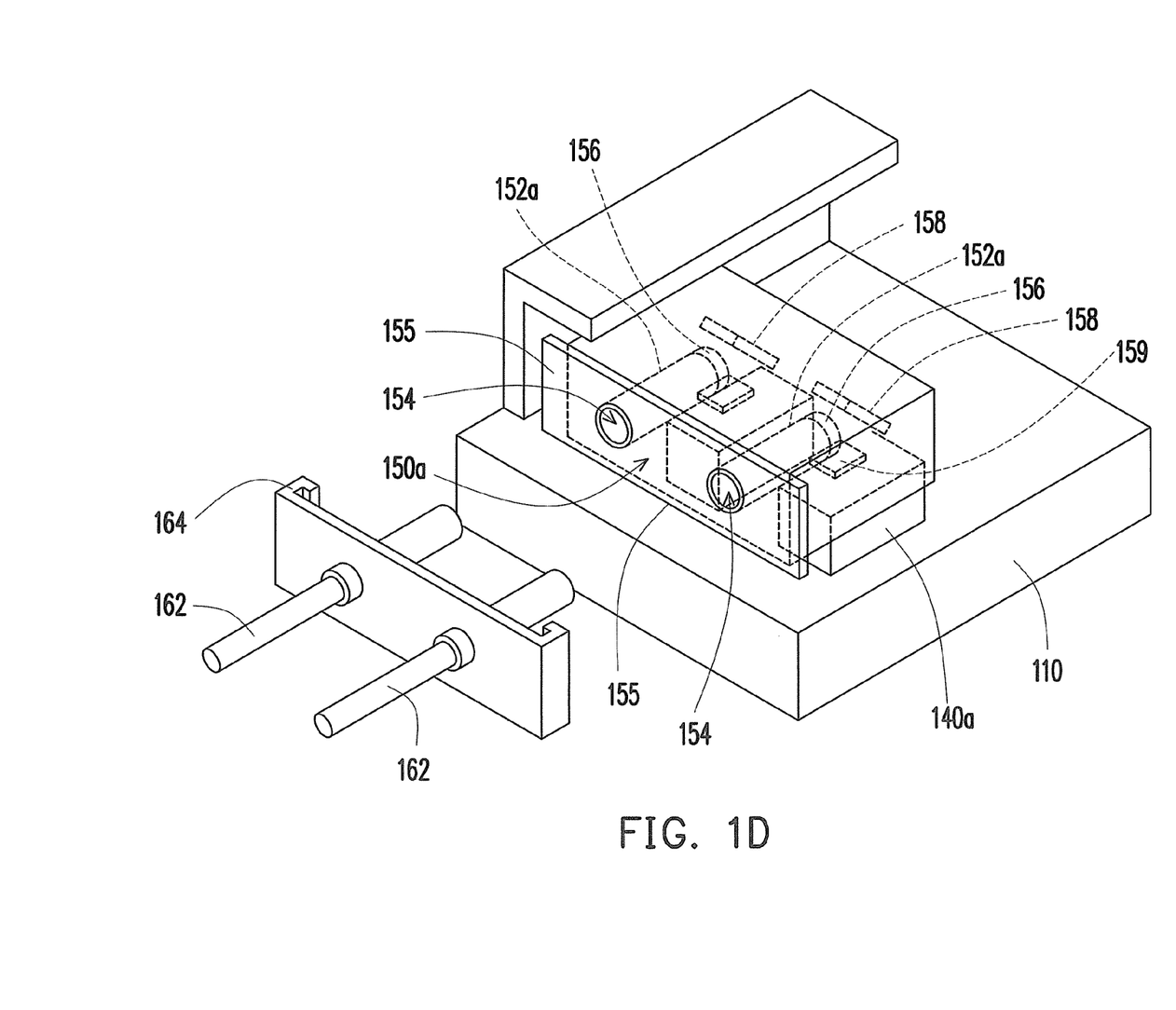
FIG. 1D is a partial three-dimensional view illustrating one of a semiconductor package structure as depicted in FIG. 1A.

Furthermore, as shown in FIG. 1D, herein, FIG. 1D is a partial three-dimensional view illustrating one of a semiconductor package structure as depicted in FIG. 1A. Two light emitting/receiving devices 140a, two optical channels 154, and two total internal reflection mirrors 158 are arranged in the package structure 110, and the light emitting/receiving devices 140a are respectively corresponding to the optical channels 154 and the total internal reflection mirrors 158 in their optical paths. It should be noted that even though the optical intermediary device 150a in the present embodiment is implemented with an optical channel 154 and a total internal reflection mirror 158, those skilled in the art can change the structure of the optical intermediary device 150a in consideration of other factors, such as the number of the corresponding light emitting/receiving devices 140a.

The optical transmission device 160a is inserted in the optical channel 154 of the optical intermediary device 150a by passing through the second locking portion 155 and connected to the first lens array 156. Herein, a light emitting by the light emitting/receiving device 140a is emitted to the optical transmission device 160a via the optical intermediary device 150a so that an optical signal is transmitted through the optical transmission device 160a. In more detail, the light emitting by the light emitting/receiving device 140a is emitted to the optical transmission device 160a by the total internal reflection mirror 158 reflecting the light to the first leans array 156. In the present embodiment, as shown in FIG. 1A, the optical transmission device 160a includes an optical fiber 162 and a first locking portion 164. Herein, the optical fiber 162 is fixed in the optical intermediary device 150a via the first locking portion 164, and a material of the first locking portion 164 is plastic. Particularly, the first locking portion 164 of the optical transmission device 160a is clipped with the second locking portion 155 of the optical intermediary device 150a in an up-and-down direction, so that the optical transmission device 160a is fixed on the optical intermediary device 150a. Certainly, as shown in FIG. 1D, the first locking portion 164 of the optical transmission device 160a may also be clipped with the second locking portion 155 of the optical intermediary device 150a in an left-and-right direction, which the present embodiment is not limited to.

Furthermore, the semiconductor package structure 100a further includes a sealing device 195a at least covering a portion of the package substrate 110, the chip 120, and a portion of the optical intermediary device 150a and exposed the second locking portion 155. In more detail, referring to FIGS. 1A and 1B, the sealing device 195a of the present embodiment is, for example, a cover, and the cover 195a has at least a slot 197a (four slots are illustrated in FIG. 1B, which the present embodiment is not limited to) located at the side of the cover 195a, wherein the second locking portion 155 of the optical intermediary device 150a is exposed outside the slot 197a. It should be noted that although the above-mentioned cover 195a has exemplarily four slots 197a, but in other embodiments, as shown in FIG. 1C, the cover 195b can have only one slot 197b according to actual requirements by the user, which the present embodiment is not limited to.

In the present embodiment, one end of the optical fiber 162 of the optical transmission device 160a is connected to the first lens array 156 of the optical intermediary device 150a, so that the light emitting by the light emitting/receiving device 140a can be emitted to the optical transmission device 160a by the total internal reflection mirror 158 reflecting the light to the first leans array 156, and the optical signal can be transmitted through the optical fiber 162. It should be noticed that the optical signal transmitted by the optical transmission device 160a can be converted into an electric signal through the light emitting/receiving device 140a. Furthermore, the optical fiber has an advantage of high transmission efficiency and is uneasy to be interfered by electromagnetic interference (EMI). Therefore, when the electric signal is transmitted through the optical transmission device 160a, the semiconductor package structure 100a of the present embodiment has advantages of high transmission efficiency and high signal transmission density. Moreover, due to a fast transmission rate of the optical transmission device 160a, besides a signal transmission time can be reduced to increase a performance of the semiconductor package structure 100a, a part of conventional signal transmission lines (not shown) can also be replaced, so as to achieve a smaller package size.

Two embodiments are described in the following to illustrate that the designs of the semiconductor package structure 100b, 100c are different from the designs of the semiconductor package structure 100a.

Figure 2:
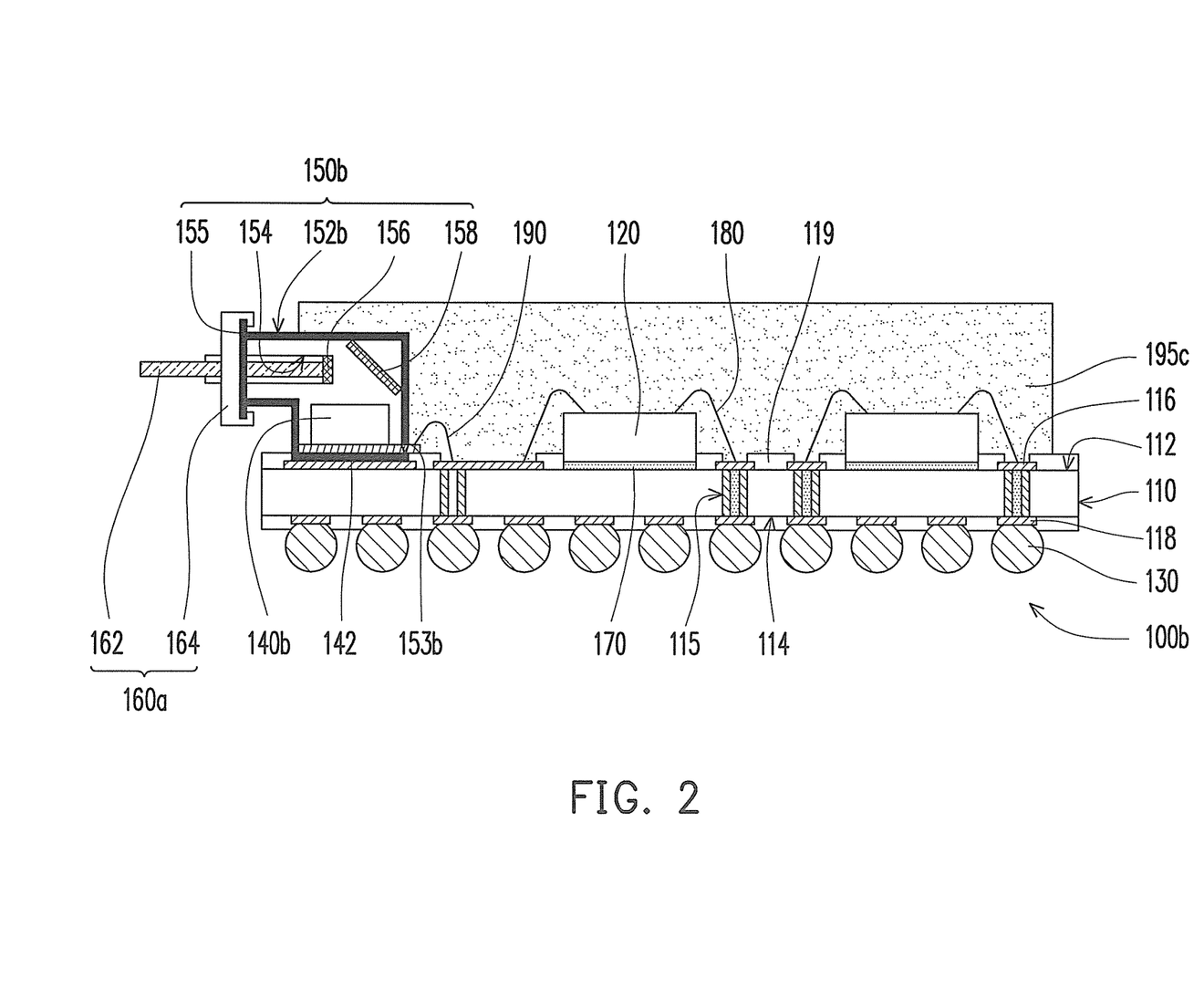
FIG. 2 is a cross-sectional view of a semiconductor package structure according to another embodiment of the invention.

FIG. 2 is a cross-sectional view of a semiconductor package structure according to another embodiment of the invention. Referring to FIG. 2, in the present embodiment, the semiconductor package structure 100b of FIG. 2 is similar to the semiconductor package structure 100a of FIG. 1A. A major difference between the two is that the semiconductor package structure 100b further includes a printed circuit board 142, wherein the light emitting/receiving device 140b and the printed circuit board 142 are disposed inside the housing 152b and the light emitting/receiving device 140b is electrically connected to the printed circuit board 142. The housing 152b has a opening 153b and a portion of the printed circuit board 142 passes through the opening 153b, and the light emitting/receiving device 140b is electrically connected to the circuit 116 via the printed circuit board 142. In more detail, a portion of printed circuit board 142 passing through the housing 152b is electrically connected to the circuit 116 via the bonding wire 190. Namely, the bonding wire 190 is connected between the circuit 116 and the portion of the circuit board 142 passing through the opening 153b.

Moreover, the sealing device 195c of the present embodiment is difference from the sealing device 195a (or sealing device 195b) of the above embodiment in FIG. 1B (or FIG. 1C). In more detail, the sealing device 195c of the present embodiment is, for example, a molding compound, and the molding compound 195c can be, for example but not limited to, made of epoxy molding compound or other plastic material with low-moisture absorption and high resistance against to the erosion. In other words, the molding compound 195c at least encapsulates a portion of the package substrate 110, the chip 120, and a portion of the optical intermediary device 150a and exposed the second locking portion 155.

Figure 3:
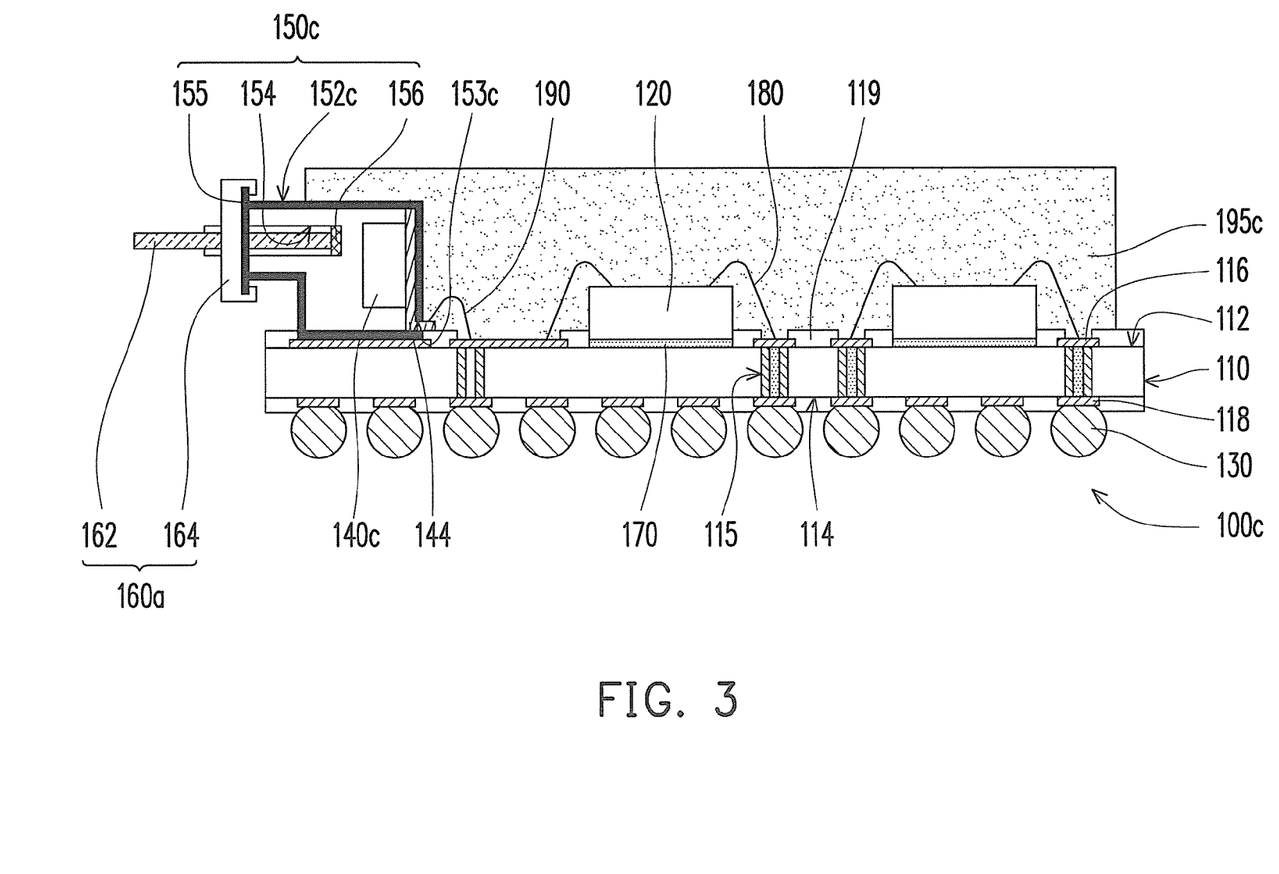
FIG. 3 is a cross-sectional view of a semiconductor package structure according to another embodiment of the invention.

FIG. 3 is a cross-sectional view of a semiconductor package structure according to another embodiment of the invention. Referring to FIG. 3, in the present embodiment, the semiconductor package structure 100c of FIG. 3 is similar to the semiconductor package structure 100b of FIG. 2. A major difference between the two is that the semiconductor package structure 100c further includes a L-shaped printed circuit board 144, wherein the light emitting/receiving device 140c and the L-shaped printed circuit board 144 are disposed inside the housing 152c and the light emitting/receiving device 140c is electrically connected to the L-shaped printed circuit board 144 and faces to the first lens array 156. The housing 152c has a opening 153c and a portion of the L-shaped printed circuit board 144 passes through the opening 153c, and the light emitting/receiving device 140c is electrically connected to the circuit 116 via the L-shaped printed circuit board 144. In more detail, a portion of printed circuit board 142 passing through the housing 152c is electrically connected to the circuit 116 via the bonding wire 190. Namely, the bonding wire 190 is connected between the circuit 116 and the portion of the L-shaped circuit board 144 passing through the opening 153c.

In the aforementioned descriptions, only the semiconductor package structure 100a, 100b, 100c are introduced, and a manufacturing method thereof is not mentioned. Therefore, one embodiments is provide below for describing the manufacturing method of the semiconductor package structure 100a is described in detail with reference of FIGS. 4A-4C. It should be noted that the below embodiment uses the same component references and subject matter as the above embodiment, to omit the description of identical content. For a detailed description of the omitted content, please refer to the above embodiment, the below embodiment will not repeat unnecessary details.

Figure 4A:
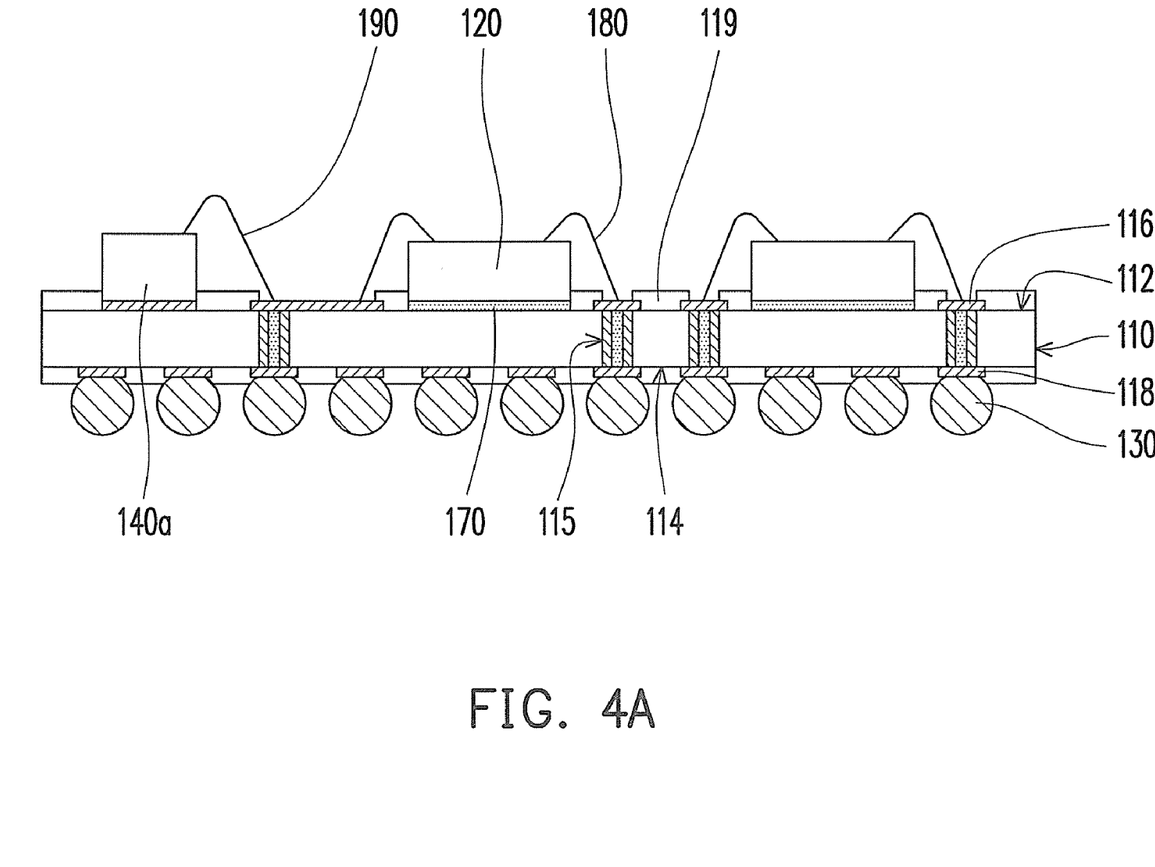
FIGS. 4A-4C are diagrams illustrating a manufacturing method of a semiconductor package structure according to an embodiment of the invention.
Figure 4B:
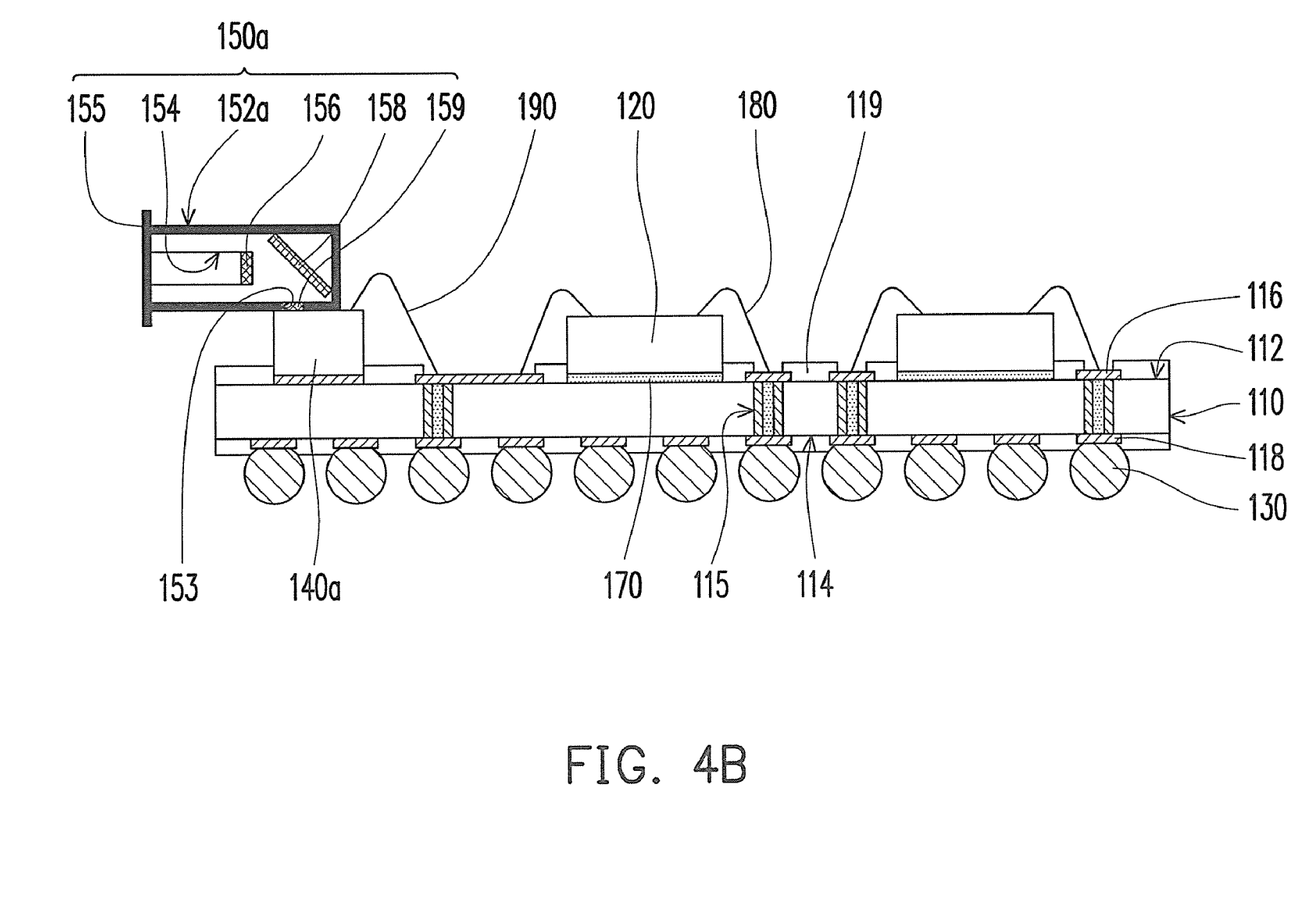
Figure 4C:
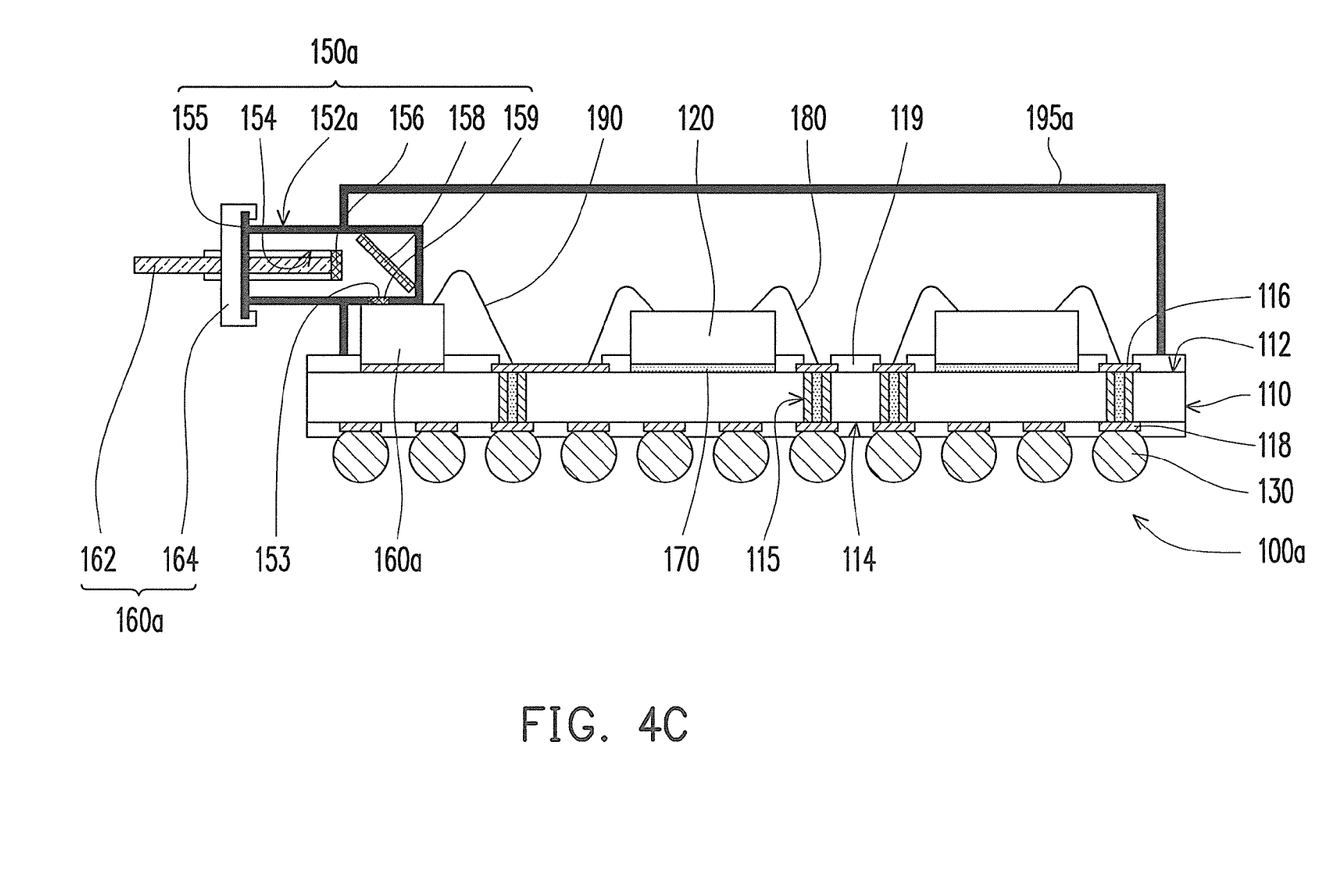

FIGS. 4A-4C are diagrams illustrating a manufacturing method of a semiconductor package structure according to an embodiment of the invention. Referring to FIG. 4A, first, a package substrate 110 having at least a chip 120 and a plurality of solder balls 130 fixed thereon is provided, wherein the package substrate 110 has a first surface 112, an opposite second surface 114, a circuit 116 disposed on the first surface 112, a plurality of solder ball pads 118 disposed on the second surface 114 and a protective layer 119 disposed on the first surface 112 and exposed a portion of the circuit 116. In more detail, each solder ball pad 118 is electrically connected to the circuit 116 by a conductive through hole structure 115, and the chip 120 is disposed on the first surface 112 by an adhesive layer 170 and electrically connected to the circuit 116 by a plurality of bonding wires 180. The solder balls 130 are respectively disposed on the solder ball pads 118 to serve as a bridge for electrically connecting the semiconductor package structure 100 and an external circuit (not shown).

Referring to FIG. 4A again, a light emitting/receiving device 140a is disposed on the package substrate 110 and electrically connected to the circuit 116 by at least a bonding wire 190, wherein the light emitting/receiving device 140a is used for emitting or receiving light, and the light emitting/receiving device 140a is, for example, a vertical-cavity surface emitting laser array.

Then, referring to FIG. 4B, an optical intermediary device 150a is disposed above the light emitting/receiving device 140a. In the present embodiment, the optical intermediary device 150a includes a housing 152a, an optical channel 154, a second locking portion 155, a first lens array 156, a total internal reflection mirror 158, and a second lens array 159. The optical channel 154, the first lens array 156 and the total internal reflection mirror 158 are disposed inside the housing 152a. The second locking portion 155 covers an end of the optical channel 154, and the first lens array 156 is disposed on the other end of the optical channel 154. Moreover, the housing 152a has a opening 153, and the second lens array 159 is disposed in the opening 153 and connected to the light emitting/receiving device 140a. A material of the second locking portion 155 is metal or heat insulation material.

Furthermore, as shown in FIG. 1D, two light emitting/receiving devices 140a, two optical channels 154, and two total internal reflection mirrors 158 are arranged in the package structure 110, and the light emitting/receiving devices 140a are respectively corresponding to the optical channels 154 and the total internal reflection mirrors 158 in their optical paths. It should be noted that even though the optical intermediary device 150a in the present embodiment is implemented with an optical channel 154 and a total internal reflection minor 158, those skilled in the art can change the structure of the optical intermediary device 150a in consideration of other factors, such as the number of the corresponding light emitting/receiving devices 140a.

Then, referring to FIGS. 4B and 4C, a sealing device 195a is provided to at least cover a portion of the package substrate 110, the chip 120, and a portion of the optical intermediary device 150a and exposed the second locking portion 155. In more detail, the sealing device 195a of the present embodiment is, for example, a cover, wherein the second locking portion 155 of the optical intermediary device 150a is exposed outside the cover 195a.

Then, referring to FIG. 4C again, an optical transmission device 160a is inserted in the optical intermediary device 150a, wherein the optical transmission device 160a includes an optical fiber 162 and a first locking portion 164. In more detail, the optical transmission device 160a is inserted in the optical channel 154 of the optical intermediary device 150a by passing through the second locking portion 155 and connected to the first lens array 156. Herein, a light emitting by the light emitting/receiving device 140a is emitted to the optical transmission device 160a via the optical intermediary device 150a so that an optical signal is transmitted through the optical transmission device 160a. Namely, the light emitting by the light emitting/receiving device 140a is emitted to the optical transmission device 160a by the total internal reflection mirror 158 reflecting the light to the first leans array 156. Moreover, the optical fiber 162 of the present invention is fixed in the optical intermediary device 150a via the first locking portion 164, and a material of the first locking portion 164 is plastic. Particularly, the first locking portion 164 of the optical transmission device 160a is clipped with the second locking portion 155 of the optical intermediary device 150a so that the optical transmission device 160a is fixed on the optical intermediary device 150a. Furthermore, a sealant 199 is disposed at the edge of the cover 195a so as to embed the optical intermediary device 150a inside the cover 195a. By now, fabrication of the semiconductor package structure 100a is completed.

In summary, since the semiconductor package structure of the invention has a light emitting/receiving device, an optical intermediary device and an optical transmission device, and the a light emitting by the light emitting/receiving device is emitted to the optical transmission device via the optical intermediary device, so that an optical signal is transmitted through the optical transmission device. Therefore, the design of the semiconductor package structure of the invention has advantages of small size, high transmission efficiency and high signal transmission density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure comprising:
   a package substrate having a first surface, an opposite second surface, a circuit disposed on the first surface and a plurality of solder ball pads disposed on the second surface, wherein each solder ball pad is electrically connected to the circuit;
   at least a chip disposed on the first surface of the package substrate and electrically connected to the circuit;
   a plurality of solder balls respectively disposed on the solder ball pads;
   a light emitting/receiving device disposed on the package substrate and electrically connected to the circuit, wherein the light emitting/receiving device is used for emitting or receiving light;
   an optical intermediary device disposed above the light emitting/receiving device; and
   an optical transmission device inserted in the optical intermediary device, wherein a light emitting by the light emitting/receiving device is emitted to the optical transmission device via the optical intermediary device so that an optical signal is transmitted through the optical transmission device.

2. The semiconductor package structure as claimed in claim 1, wherein the light emitting/receiving device comprises a vertical-cavity surface emitting laser array.

3. The semiconductor package structure as claimed in claim 1, wherein the optical intermediary device comprises a housing, a optical channel and first lens array, the optical channel is disposed inside the housing, the first lens array is disposed on an end of the optical channel, the optical transmission device is inserted in the optical channel and connected to the first lens array.

4. The semiconductor package structure as claimed in claim 3, wherein the optical intermediary device further comprises a total internal reflection mirror, the total internal reflection mirror is disposed inside the housing, and the light emitting by the light emitting/receiving device is emitted to the optical transmission device by the total internal reflection mirror reflecting the light to the first leans array.

5. The semiconductor package structure as claimed in claim 4, wherein the optical intermediary device further comprises a second lens array, the housing has a opening, and the second lens array is disposed in the opening and connected to the light emitting/receiving device.

6. The semiconductor package structure as claimed in claim 4, further comprising a printed circuit board, wherein the light emitting/receiving device and the printed circuit board are disposed inside the housing and the light emitting/receiving device is electrically connected to the printed circuit board, the housing has a opening and a portion of the printed circuit board passes through the opening, and the light emitting/receiving device is electrically connected to the circuit via the printed circuit board.

7. The semiconductor package structure as claimed in claim 6, further comprising at least a bonding wire, wherein the bonding wire is connected between the circuit and the portion of the printed circuit board passing through the opening, and the printed circuit board is electrically connected to the circuit via the bonding wire.

8. The semiconductor package structure as claimed in claim 3, further comprising a L-shaped printed circuit board, wherein the light emitting/receiving device, the L-shaped printed circuit board and the optical channel are disposed inside the housing, the light emitting/receiving device is electrically connected to the L-shaped printed circuit board and faces to the first lens array, the housing has a opening and a portion of the L-shaped printed circuit board passes through the opening, and the light emitting/receiving device is electrically connected to the circuit via the L-shaped printed circuit board.

9. The semiconductor package structure as claimed in claim 8, further comprising at least a bonding wire, wherein the bonding wire is connected between the circuit and the portion of the L-shaped printed circuit board passing through the opening, and the L-shaped printed circuit board is electrically connected to the circuit via the bonding wire.

10. The semiconductor package structure as claimed in claim 1, wherein the optical transmission device comprises an optical fiber and a first locking portion, the optical fiber is fixed in the optical intermediary device via the first locking portion.

11. The semiconductor package structure as claimed in claim 10, wherein a material of the first locking portion is plastic.

12. The semiconductor package structure as claimed in claim 10, wherein the optical intermediary device has a second locking portion, the first locking portion of the optical transmission device is clipped with the second locking portion of the optical intermediary device.

13. The semiconductor package structure as claimed in claim 12, wherein a material of the second locking portion is metal or heat insulation material.

14. The semiconductor package structure as claimed in claim 1, further comprising a sealing device at least covering a portion of the package substrate, the chip, and a portion of the optical intermediary device.

15. The semiconductor package structure as claimed in claim 14, wherein the sealing device comprises a molding compound or a cover.

16. The semiconductor package structure as claimed in claim 15, wherein the cover has at least a slot located at the side of the cover, wherein a portion of the optical intermediary device is exposed outside the slot.

17. The semiconductor package structure as claimed in claim 1, wherein the chip is electrically connected to the circuit by wire bonding.

18. A manufacturing method of a semiconductor package structure comprising:
   providing a package substrate having at least a chip and a plurality of solder balls fixed thereon, wherein the package substrate has a first surface, an opposite second surface, a circuit disposed on the first surface and a plurality of solder ball pads disposed on the second surface, each solder ball pad is electrically connected to the circuit, the chip is disposed on the first surface and electrically connected to the circuit, and the solder balls are respectively disposed on the solder ball pads;

disposing a light emitting/receiving device on the package substrate and electrically connected to the circuit, wherein the light emitting/receiving device is used for emitting or receiving light;

disposing an optical intermediary device above the light emitting/receiving device; and inserting an optical transmission device in the optical intermediary device, wherein a light emitting by the light emitting/receiving device is emitted to the optical transmission device via the optical intermediary device so that an optical signal is transmitted through the optical transmission device.

19. The manufacturing method of the semiconductor package structure as claimed in claim 18, wherein the light emitting/receiving device comprises a vertical-cavity surface emitting laser array.

20. The manufacturing method of the semiconductor package structure as claimed in claim 18, wherein the optical intermediary device comprises a housing, a optical channel and first lens array, the optical channel is disposed inside the housing, the first lens array is disposed on an end of the optical channel, the optical transmission device is inserted in the optical channel and connected to the first lens array.

21. The manufacturing method of the semiconductor package structure as claimed in claim 20, wherein the optical intermediary device further comprises a total internal reflection mirror, the total internal reflection mirror is disposed inside the housing, and the light emitting by the light emitting/receiving device is emitted to the optical transmission device by the total internal reflection mirror reflecting the light to the first leans array.

22. The manufacturing method of the semiconductor package structure as claimed in claim 21, wherein the optical intermediary device further comprises a second lens array, the housing has a opening, and the second lens array is disposed in the opening and connected to the light emitting/receiving device.

23. The manufacturing method of the semiconductor package structure as claimed in claim 21, further comprising a printed circuit board, wherein the light emitting/receiving device and the printed circuit board are disposed inside the housing and the light emitting/receiving device is electrically connected to the printed circuit board, the housing has a opening and a portion of the printed circuit board passes through the opening, and the light emitting/receiving device is electrically connected to the circuit via the printed circuit board.

24. The manufacturing method of the semiconductor package structure as claimed in claim 23, further comprising at least a bonding wire, wherein the bonding wire is connected between the circuit and the portion of the printed circuit board passing through the opening, and the printed circuit board is electrically connected to the circuit via the bonding wire.

25. The manufacturing method of the semiconductor package structure as claimed in claim 20, further comprising a L-shaped printed circuit board, wherein the light emitting/receiving device, the L-shaped printed circuit board and the optical channel are disposed inside the housing, the light emitting/receiving device is electrically connected to the L-shaped printed circuit board and faces to the first lens array, the housing has a opening and a portion of the L-shaped printed circuit board passes through the opening, and the light emitting/receiving device is electrically connected to the circuit via the L-shaped printed circuit board.

26. The manufacturing method of the semiconductor package structure as claimed in claim 25, further comprising at least a bonding wire, wherein the bonding wire is connected between the circuit and the portion of the L-shaped printed circuit board passing through the opening, and the L-shaped printed circuit board is electrically connected to the circuit via the bonding wire.

27. The manufacturing method of the semiconductor package structure as claimed in claim 18, wherein the optical transmission device comprises an optical fiber and a first locking portion, the optical fiber is fixed in the optical intermediary device via the first locking portion.

28. The manufacturing method of the semiconductor package structure as claimed in claim 27, wherein a material of the first locking portion is plastic.

29. The manufacturing method of the semiconductor package structure as claimed in claim 27, wherein the optical intermediary device has a second locking portion, the first locking portion of the optical transmission device is clipped with the second locking portion of the optical intermediary device.

30. The manufacturing method of the semiconductor package structure as claimed in claim 29, wherein a material of the second locking portion is metal or heat insulation material.

31. The manufacturing method of the semiconductor package structure as claimed in claim 18, further comprising a sealing device at least covering a portion of the package substrate, the chip, and a portion of the optical intermediary device.

32. The manufacturing method of the semiconductor package structure as claimed in claim 31, wherein the sealing device comprises a molding compound or a cover.

33. The manufacturing method of the semiconductor package structure as claimed in claim 32, wherein the cover has at least a slot located at the side of the cover, wherein a portion of the optical intermediary device is exposed outside the slot.

34. The manufacturing method of the semiconductor package structure as claimed in claim 18, wherein the chip is electrically connected to the circuit by wire bonding.

* * * * *